United States Patent [19]
Teene

[11] Patent Number: 5,903,577
[45] Date of Patent: May 11, 1999

[54] METHOD AND APPARATUS FOR ANALYZING DIGITAL CIRCUITS

[75] Inventor: Andres R. Teene, Fort Collins, Colo.

[73] Assignee: LSI Logic Corporation, Milpitas, Calif.

[21] Appl. No.: 08/940,912

[22] Filed: Sep. 30, 1997

[51] Int. Cl.$^6$ .............................. G01R 31/28; G06F 15/00
[52] U.S. Cl. ......................... 371/22.1; 364/488; 364/489
[58] Field of Search .......................... 371/22.1; 364/488, 364/489, 490, 468.16, 578; 395/568

[56] References Cited

U.S. PATENT DOCUMENTS

| | | | |
|---|---|---|---|
| 4,763,289 | 8/1988 | Barzilai et al. | 364/578 |
| 5,095,454 | 3/1992 | Huang | 364/578 |
| 5,191,541 | 3/1993 | Landman et al. | 364/489 |
| 5,365,528 | 11/1994 | Agrawal et al. | 371/25.1 |
| 5,422,891 | 6/1995 | Bushnell et al. | 371/22.4 |
| 5,469,367 | 11/1995 | Puri et al. | 364/489 |
| 5,550,841 | 8/1996 | O'Brien | 371/22.1 |
| 5,572,717 | 11/1996 | Pedersen | 395/555 |
| 5,583,787 | 12/1996 | Underwood et al. | 364/489 |
| 5,787,092 | 7/1998 | Jaynes et al. | 371/22.1 |
| 5,801,955 | 9/1998 | Burgun et al. | 364/489 |

*Primary Examiner*—Hoa T. Nguyen
*Attorney, Agent, or Firm*—David K. Lucente

[57] ABSTRACT

A method in a data processing system for identifying hazards in a circuit. Signal paths are identified in the circuit. Each signal path within the plurality of signal paths begins at a source and ends at a target and each signal path within the signal paths is one that potentially propagates a hazard. Errors are then identified in signal paths in the circuit by analyzing the timing relationships and hazard characteristics of the signals within the signal paths.

20 Claims, 6 Drawing Sheets

METHOD AND APPARATUS FOR ANALYZING DIGITAL CIRCUITS

BACKGROUND OF THE INVENTION

1. Technical Field

The present invention relates generally to an improved data processing system and in particular to computer aided engineering programs. Still more particularly, the present invention relates to an improved method and apparatus for verification of digital circuits.

2. Description of the Related Art

Much of the process of creating, testing, and implementing an electronic circuit has been automated by the use of computers as a design tool. The computer executes a design or engineering program that provides a human user with tools such as "capturing" a design into electronic form, editing the design with the computer, detecting errors in the design, simulating the operation of the design and translating the design into a component layout or integrated circuit mask pattern depending on the final implementation. The availability of efficient, user-friendly software tools to aid the designer has become very important as the size and complexity of circuits designs increases.

One function provided by computer aided design tools is automatic synthesis and optimization of a circuit design from a schematic diagram. The computer aided design (CAD) system is given a set of constraints, such as timing specifications, and produces a circuit that performs the logic of the schematic diagram while meeting the specified constraints. A typical constraint is, e.g., minimum propagation delay from an input to an output. The CAD system may have to improve the speed of portions of the design by implementing logic functions in combinatorial logic as opposed to standard cells, by using faster logic families or by reducing the number of components used to achieve time critical logic functions.

The synthesis and optimization of a design from a schematic diagram can be complex and time consuming both to the human designer and to the computer's resources where the circuit of the schematic diagram is large and the constraints are many and stringent. Further, requiring the designer to specify constraints to the computer program in the first place can be very burdensome and time consuming. The designer must evaluate many factors including, for example, signal relationships, manufacturing costs, the timing of external signals that the circuit must interface with, and tolerances of components used in the circuit.

Asynchronous logic circuits are present in and critical in the design of low power, delay sensitive, high performance digital circuits. Typically, asynchronous logic circuits are used in real time applications involving digital communication and computer systems. Although there are some automated methodologies which can provide machine design of some types of asynchronous circuits, heretofore no practical automated methodology has existed which could successfully provide design solutions for real applications. Therefore, the solution of complex asynchronous circuit design problems always required intuition and experience, and was consequently a difficult and error prone task. Often the design of the asynchronous circuit entails a substantial amount of time to debug.

Historically, dynamic simulations have been used to verify circuit functionality and timing. Dynamic simulation rely on vectors for the simulation of functionality and timing. However, due to increasing design complexities it is virtually impossible to fully verify a circuit with dynamic simulations because of the size of the vectors needed to simulate each state of the circuit. Static timing analysis tools which do not rely on vectors have been developed to verify circuit timing. Static timing analysis tools have the capability to verify circuit timings more completely and efficiently because they can analyze all possible timing paths, provided the design synchronous. For pure synchronous designs, static timing analysis can verify 100% of all timing paths. However, static timing analysis can not fully verify non-synchronous circuits such as circuits with glitches, asynchronous clocks or other types of hazards that can cause the circuit to fail. Presently, this limitation still requires that dynamic timing simulations be used to verify these type of non-synchronous circuits. Even with dynamic timing simulation it is difficult to fully verify a circuit for these type of non-synchronous hazards because it is virtually impossible to simulate enough patterns to identify all possible hazards in the circuit.

Therefore, it would be advantageous to have an improved method and apparatus for analyzing asynchronous circuits.

SUMMARY OF THE INVENTION

The present invention provides a method in a data processing system for identifying hazards in synchronous and asynchronous circuits. Signal paths are identified in the circuit. Each signal path within the plurality of signal paths begins at a source and ends at a target and each signal path within the signal paths is one that potentially propagates a hazard. Errors are then identified in signal paths in the circuit by analyzing the timing relationships and hazard characteristics of the signals within the signal paths.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
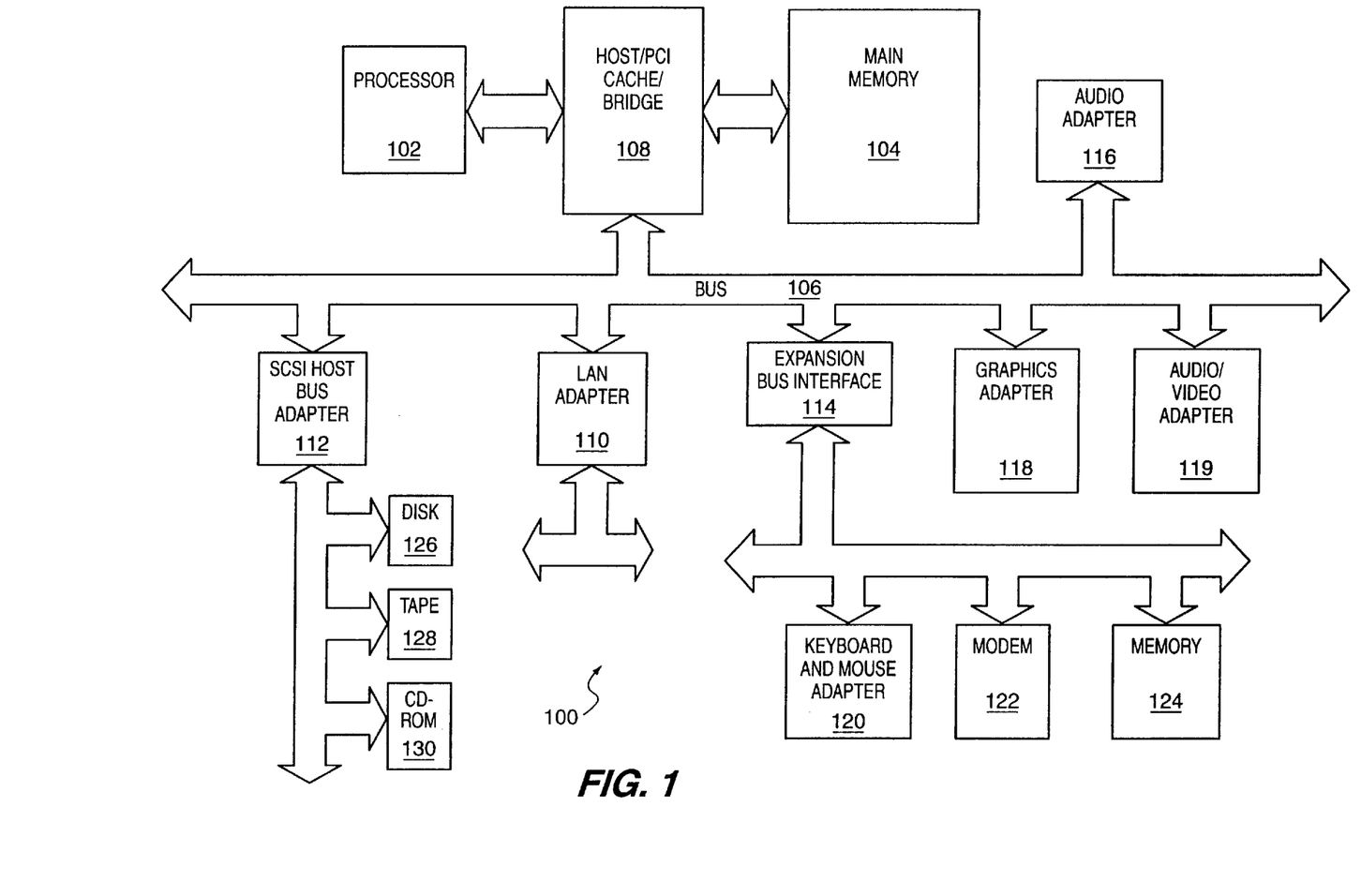
FIG. 1 is a block diagram of a data processing system in the present invention may be implemented.

With reference now to the figures, and in particular with reference to FIG. 1, a block diagram of a data processing system 100 in which the present invention may be implemented is illustrated. Data processing system 100 employs a peripheral component interconnect (PCI) local bus architecture. Although the depicted example employs a PCI bus, other bus architectures such as Micro Channel and ISA may be used. Processor 102 and main memory 104 are connected to PCI local bus 106 through PCI bridge 108. PCI bridge 108 also may include an integrated memory controller and cache memory for processor 102. Additional connections to PCI local bus 106 may be made through direct component interconnection or through add-in boards. In the depicted example, local area network (LAN) adapter 110, SCSI host bus adapter 112, and expansion bus interface 114 are connected to PCI local bus 106 by direct component connection. In contrast, audio adapter 116, graphics adapter 118, and audio/video adapter (A/V) 119 are connected to PCI local bus 106 by add-in boards inserted into expansion slots. Expansion bus interface 114 provides a connection for a keyboard and mouse adapter 120, modem 122, and additional memory 124. SCSI host bus adapter 112 provides a connection for hard disk drive 126, tape drive 128, and CD-ROM 130 in the depicted example.

Typical PCI local bus implementations will support three or four PCI expansion slots or add-in connectors. The depicted example includes four loads on the mother board and three expansion slots. Those of ordinary skill in the art will appreciate that the hardware in FIG. 1 may vary. For example, other peripheral devices, such as optical disk drives and the like may be used in addition to or in place of the hardware depicted in FIG. 1. The depicted example is not meant to imply architectural limitations with respect to the present invention.

Figure 2:
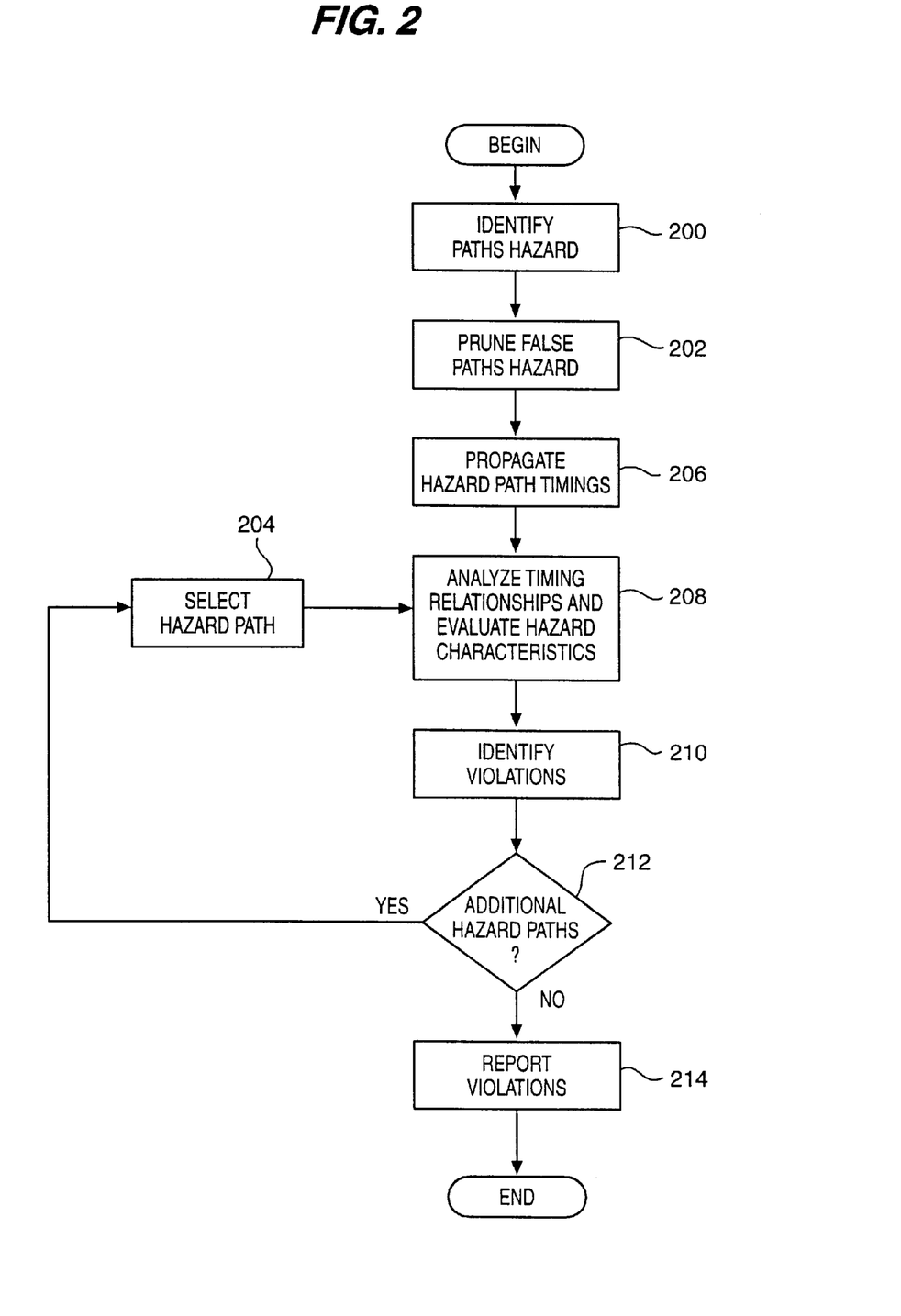
FIG. 2 is a flowchart of a process for analyzing asynchronous circuits in accordance with a preferred embodiment of the present invention.

Turning now to FIG. 2, a flowchart of a process for analyzing asynchronous circuits is depicted in accordance with a preferred embodiment of the present invention. This process allows verification of asynchronous circuits without the need for dynamic vectors or simulations. Additionally, this process provides for the efficient analysis and verification of circuits that cannot be verified with static timing analysis. The process in FIG. 2 is performed for a circuit. The process begins by identifying hazard paths for a circuit (step 200). Next, the process prunes or removes false hazard paths from the hazard paths identified in step 200 (step 202). For example, with glitches as a hazard, functional analysis may be used to remove paths that are disabled based on the functional state of specified nodes and cells within a circuit. A hazard path is selected from the remaining hazard paths (step 204).

Then, path timing is then propagated through the selected path (step 206). The potential hazard path is evaluated on the hazard characteristics (step 208). Violations are identified in response to the hazard analysis (step 210). The potential hazard paths are evaluated by analyzing the timing relationships of the path or combination of paths. The hazard path timing relationships for this analysis are based on the timing characteristics of the hazard being evaluated. A determination is made as to whether additional hazard paths are present for analysis (step 212). If additional hazard paths are present, the process returns to step 204. Otherwise, the process reports violations identified in step 210 (step 214) with the process terminating thereafter. The process in FIG. 2 may be applied to identifying asynchronous hazards, such as, for example, glitches, race conditions, and synchronization of multiple clock domains.

Figure 3:
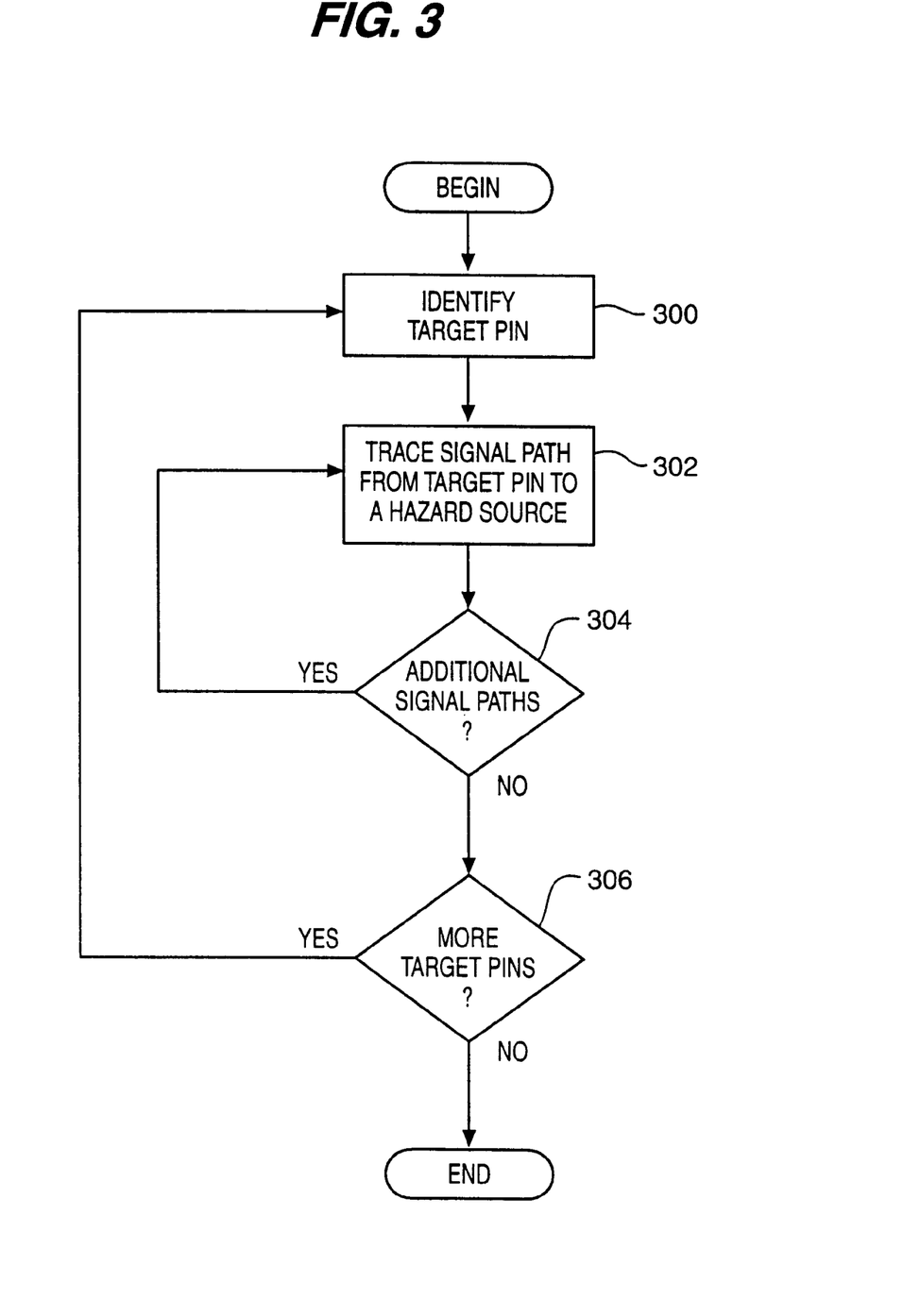
FIG. 3 is a flowchart of a process for identifying hazard paths in accordance with a preferred embodiment of the present invention.

Turning now to FIG. 3, a flowchart of a process for identifying potential hazard paths is depicted in accordance with a preferred embodiment of the present invention. The process begins with identifying a target pin (step 300). Thereafter, a signal path is traced from the target pin to a hazard source (step 302). A determination is made as to whether additional signal paths are present (step 304). If additional signal paths are present, the process then returns to step 302. Otherwise, the process determines whether additional target pins are present (step 306). If additional target pins are present, the process returns to step 300 to identify another target pin for tracing signal paths. Otherwise, the process then terminates.

In the case of glitches, a hazard source is for example, an input signal or register output where a glitch or signal transition can be generated by a non-clock signal along that path. Signal paths that contain glitches are identified using the process illustrated in FIG. 3. The target pins in such a case are, for example, clock and/or set/reset pins. A target pin is any pin in which a glitch can change the state of a register circuit, such as, for example, a flip flop or a latch.

Figure 4A:
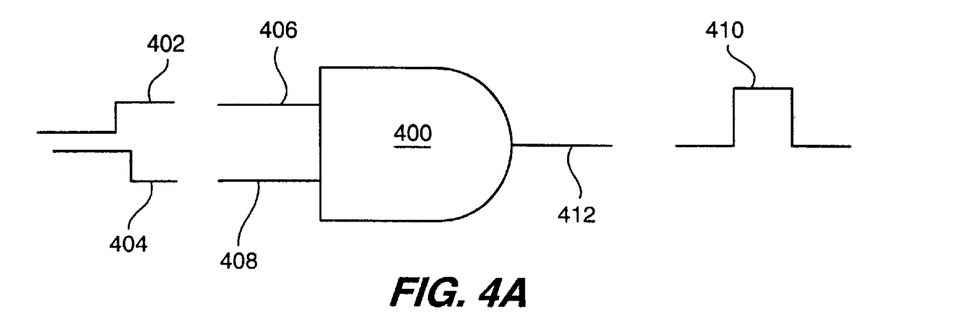
FIG. 4A is an illustration of glitch generation.
Figure 4B:
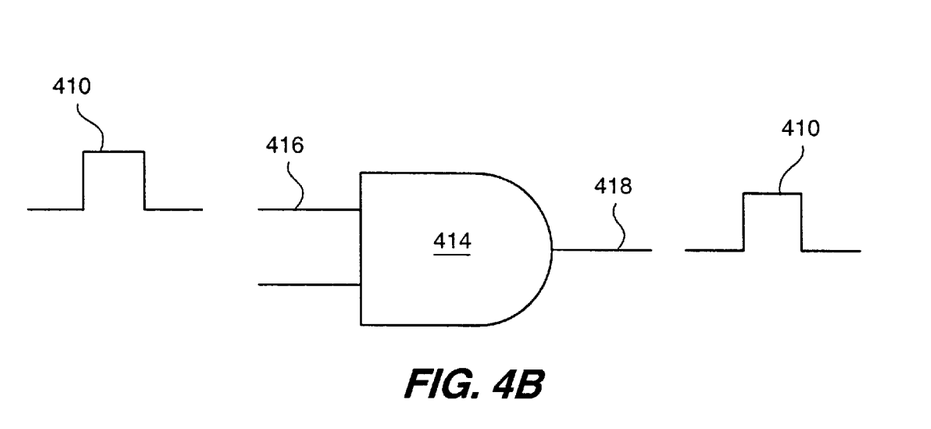
FIG. 4B illustrates the propagation of a glitch signal.
Figure 4C:
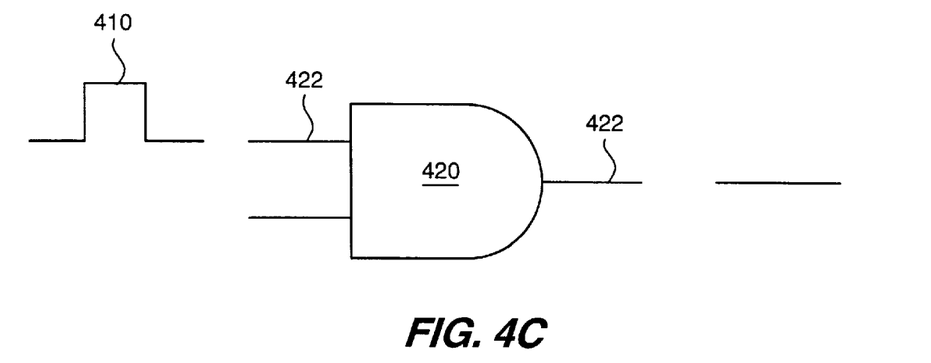
FIG. 4C is an illustration of glitch swallowing.

Turning to FIG. 4A, an illustration of glitch generation is depicted. AND gate 400 receives signals 402 and 404 at inputs 406 and 408, respectively. Based on the timing relationship of signals 402 and 404, a glitch illustrated by glitch signal 410 occurs at output 412. FIG. 4B illustrates the propagation of glitch signal 410 through AND gate 414. Glitch signal 410 is received by AND gate 414 at input 416 and is present at output 418 if the duration of the glitch on the input is greater than that of the glitch threshold of the cell. FIG. 4C is an illustration of glitch swallowing. AND gate 420 receives glitch signal 410 at input 422 in which glitch signal 410 does not occur at output 422 of AND gate 420 if the duration of the glitch on the input is less than that of the glitch threshold of the cell.

Figure 5:
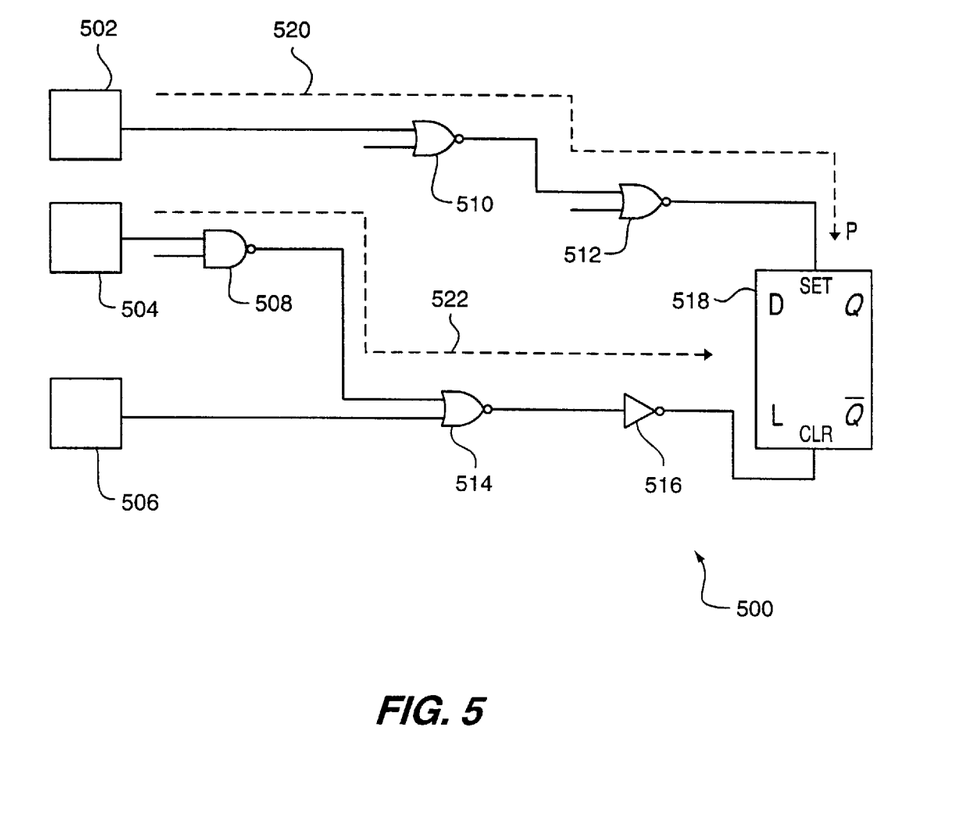
FIG. 5 is an illustration of a portion of a cell in which glitch paths are present.

FIG. 5 is an illustration of a portion of circuit 500 in which glitch paths are present. Circuit 500 includes input pins 502 and 504 along with clock pin 506. Circuit 500 also includes NAND gate 508 and NOR gates 512, and 514. Circuit 500 also includes an inverter 516 and a latch 518. In the depicted example, two glitch paths are present in circuit 500. Glitch path 520 begins at the set input of latch 518 and traces back through NOR gate 512 and NOR gate 510 to input pin 502. Glitch path 522 begins at the clock input of latch 518 and traces back through inverter 516, NOR gate 514, and NAND gate 508 to input pin 504. Clock signals are signals with specified timings. A glitch path may start at a clock signal.

Figure 6:
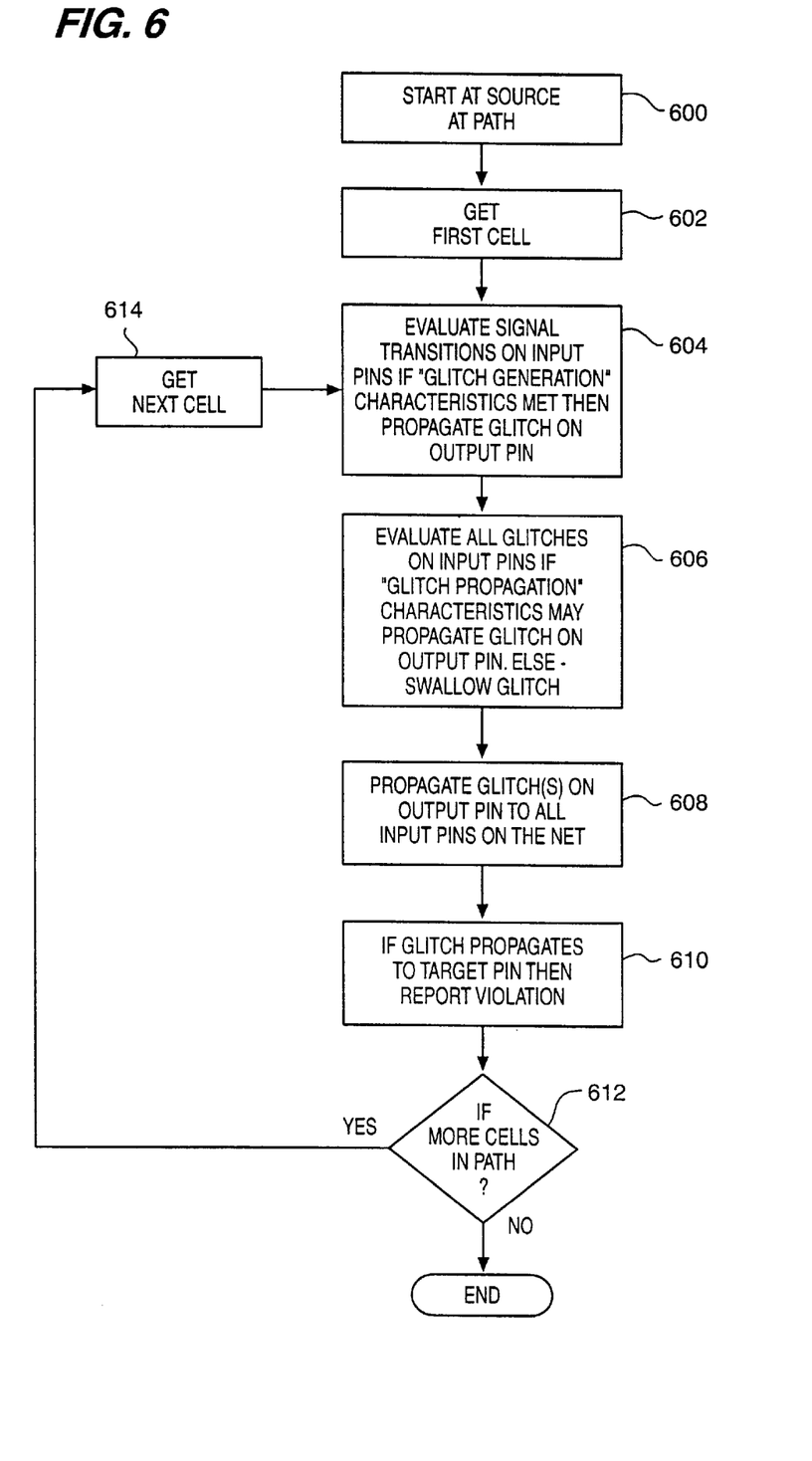
FIG. 6 is a process for identifying glitch path timing in accordance with a preferred embodiment of the present invention.

Referring now to FIG. 6, a process for identifying glitch path timing is depicted in accordance with a preferred embodiment of the present invention. Glitch path timing is calculated by using timing constraints, signal arrival times and clock specifications, circuit delays, and functional information. The process begins by starting the analysis at the source of the path (step 600). The first cell in the path is obtained (step 602). This cell, may be, for example, a flip flop or latch. A cell is a logic element with inputs and outputs where the outputs are a logical function of the inputs. Signal transitions on the input pins for the cell are evaluated if glitch generation characteristics indicate that a glitch may be generated on the output pin (step 604). Next, all glitches on input pins are evaluated if glitch propagation characteristics indicate that the glitch may be propagated to an output pin (step 606). Otherwise, the glitch is "swallowed". The glitch or glitches are propagated from the cell output pin to all input pins on the net (step 608). A net is the logical connection between cells; it connects the output of one cell with the input of other cells. All glitches propagated to the target pin are reported as a violation (step 610). In the depicted example, any glitch that is propagated to a target pin will be reported as a violation along with the timing information, the initial signal transitions that initiate the glitch, and the glitch path which all is available with this analysis. A determination is then made as to whether additional cells are in the path (step 612). If additional cells are present, the next cell in the path is obtained for analysis (step 614). Otherwise, the process terminates because all of the paths have been analyzed.

The glitch path timing, identified using the process in FIG. 6, describes the timing relationship of the potential glitches at various nodes in the circuit as the glitch propagates from the source to the target. The glitch timing can be specified as a delay and duration. The glitch path timing is calculated by tracing forward the signal and clock transitions from the source of the path. A glitch will be generated and propagated through a cell if multiple signal transitions occur at the inputs within a minimum amount of time that is greater than the glitch threshold of the cell. The timing for the generated glitch will be calculated based on the arrival time of the signal transitions and the propagation delay of the cell. This analysis can be done with min, typ, max timings or with statistical timings. The signal transitions and glitches will be propagated forward through the rest of the path and timing will be updated accordingly. Glitches will be swallowed, not propagated, by a cell if the glitch duration is less than the specified glitch threshold for that cell. Multiple glitches may be generated and propagated through a cell. These glitches are propagated through the path until they are either swallowed or hit a target pin.

The use of the functional analysis can reduce the number of potential false violations reported by eliminating paths that are logically disabled.

Thus, the present invention provides an improved method and apparatus for analyzing and verifying asynchronous hazards in circuit designs. The present invention provides for efficient analysis of circuits that cannot be verified using static timing analysis and provides for a higher level of verification coverage of hazards, such as, for example, glitches, than possible with dynamic timing simulations. The present invention provides an advantage over dynamic and static timing analysis by combining signal path tracing and functional analysis to verify asynchronous circuits and hazards. The present invention does not require the use of dynamic vectors or simulations. The present invention may be applied to circuits that contain a mixture of synchronous and asynchronous sub-circuits.

It is important to note that while the present invention has been described in the context of a fully functioning data processing system, those of ordinary skill in the art will appreciate that the processes of the present invention are capable of being distributed in a form of a computer readable medium of instructions and a variety of forms and that the present invention applies equally regardless of the particular type of signal bearing media actually used to carry out the distribution. Examples of computer readable media include: recordable-type media such a floppy discs and CD-ROMs and transmission-type media such as digital and analog communications links.

The description of the preferred embodiment of the present invention has been presented for purposes of illustration and description, but is not limited to be exhaustive or limited to the invention in the form disclosed. Many modifications and variations will be apparent to those of ordinary skill in the art. For example, although the specific hazard illustrated was a glitch, the present invention may be applied to other types of hazard analysis, such as, for example, race conditions and synchronization of multiple clock domains. That the embodiment was chosen and described in order to best explain the principles of the invention the practical application to enable others of ordinary skill in the art to understand the invention for various embodiments with various modifications as are suited to the particular use contemplated.

What is claimed is:

1. A method in a data processing system for identifying hazards in a circuit, the method comprising the data processing system implemented steps of:

identifying a plurality of signal paths in the circuit, wherein each signal path within the plurality of signal paths begins at a source and ends at a target and wherein each signal path within the plurality of signal paths potentially propagates a hazard; and identifying errors within the plurality of signal paths in the circuit by analyzing timing relationships and hazard characteristics of signals within the plurality of signal paths.

2. The method of claim 1, wherein the step of identifying errors within the plurality of signal paths comprises:

determining whether a signal path is to be removed from the plurality of signal paths using functional analysis to form a set of remaining signal paths; and identifying errors within the plurality of signal paths in the circuit by analyzing timing relationships and hazard characteristics of signals within the plurality of signal paths.

3. The method of claim 1, wherein the hazard is a glitch.

4. A method in a data processing system for identifying glitches in a digital circuit, the method comprising the data processing system implemented steps of:

identifying a plurality of signal paths in the digital circuit;

identifying whether a signal path is to be removed from the from the plurality of signal paths using functional analysis to form a set of remaining signal paths;

determining timing for the set of remaining signal paths;

propagating the determined timing for the set of remaining signal paths; and identifying violations within the signal paths.

5. The method of claim 4, wherein the step of identifying a plurality of signal paths comprises identifying target pins and tracing a path back to a potential glitch source.

6. The method of claim 4, wherein the step of identifying violations comprises identifying glitches propagated to a target pin.

7. A data processing system for analyzing a circuit, the data processing system comprising:

first identification means for identifying a plurality of signal paths in the circuit, wherein each signal path within the plurality of signal paths begins at a source and ends at a target and wherein each signal path within the plurality of signal paths potentially propagates a hazard; and second identification means for identifying errors within the plurality of signal paths in the circuit by analyzing timing relationships and hazard characteristics of signals within the plurality of signal paths.

8. The data processing system of claim 7, wherein the second identification means comprises:

determination means for determining whether a signal path is to be removed from the plurality of signal paths using functional analysis to form a set of remaining signal paths; and identification means for identifying errors within the plurality of signal paths in the circuit by analyzing timing relationships and hazard characteristics of signals within the plurality of signal paths.

9. The data processing system of claim 7, wherein the hazard is a glitch.

10. A data processing system for identifying glitches in a digital circuit, the data processing system comprising:

first identification means for identifying a plurality of signal paths in the digital circuit;

second identification means for identifying whether a signal path is to be removed from the from the plurality of signal paths using functional analysis to form a set of remaining signal paths;

determination means for determining timing for the set of remaining signal paths;

propagating means for propagating the determined timing for the set of remaining signal paths; and third identification means for identifying violations within the signal paths.

11. The data processing system of claim 10, wherein the first identification means comprises means for identifying target pins and tracing a path back to a potential glitch source.

12. The data processing system of claim 10, wherein the third identification means comprises means for identifying glitches propagated to a target pin.

13. The data processing system of claim 10, wherein the target pins includes a clock pin.

14. The data processing system of claim 11, wherein the target pins includes a set/reset pin.

15. The data processing system of claim 10, wherein the digital circuit is an asynchronous digital circuit.

16. The data processing system of claim 10, wherein the digital circuit includes asynchronous sub-circuits and synchronous sub-circuits.

17. A computer program product for use with a data processing system for, the computer program product comprising:

a computer usable medium;

first instructions for identifying a plurality of signal paths in the circuit, wherein each signal path within the plurality of signal paths begins at a source and ends at a target and wherein each signal path within the plurality of signal paths potentially propagates a hazard; and second instructions for identifying errors within the plurality of signal paths in the circuit by analyzing timing relationships and hazard characteristics of signals within the plurality of signal paths, wherein the instructions are embodied within the computer usable medium.

18. The computer program product of claim 17, wherein the computer useable medium is a random access memory.

19. The computer program product of claim 17, wherein the computer useable medium is a CD-ROM.

20. The computer program product of claim 17, wherein the computer useable medium is a hard disk drive.

\* \* \* \* \*